United States Patent
Zhou et al.

(10) Patent No.: US 10,840,210 B2
(45) Date of Patent: *Nov. 17, 2020

(54) METHODS AND SYSTEMS FOR MANUFACTURING SEMICONDUCTOR DEVICES

(71) Applicant: Micron Technology, Inc., Boise, ID (US)

(72) Inventors: Wei Zhou, Boise, ID (US); Bret K. Street, Meridian, ID (US); Benjamin L. McClain, Boise, ID (US); Mark E. Tuttle, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/236,257

(22) Filed: Dec. 28, 2018

(65) Prior Publication Data

US 2020/0212000 A1 Jul. 2, 2020

(51) Int. Cl.
*H01L 21/00* (2006.01)
*H01L 23/00* (2006.01)
*H01L 23/48* (2006.01)

(52) U.S. Cl.
CPC .......... *H01L 24/75* (2013.01); *H01L 23/481* (2013.01); *H01L 24/81* (2013.01); *H01L 24/97* (2013.01); *H01L 2224/75317* (2013.01); *H01L 2224/81203* (2013.01); *H01L 2224/95091* (2013.01)

(58) Field of Classification Search
CPC ......... H01L 24/75; H01L 24/81; H01L 24/97; H01L 23/481; H01L 2224/75317; H01L 2224/81203; H01L 2224/95091

USPC .......................................................... 438/109
See application file for complete search history.

(56) References Cited

U.S. PATENT DOCUMENTS

| 2005/0133895 | A1* | 6/2005 | Ujiie | ................... | H01L 23/3121 |
| | | | | | 257/678 |
| 2008/0309688 | A1* | 12/2008 | Haaheim | ............... | G03F 7/0002 |
| | | | | | 346/140.1 |
| 2012/0247664 | A1* | 10/2012 | Kobayashi | .............. | H01L 24/75 |
| | | | | | 156/285 |

(Continued)

OTHER PUBLICATIONS

U.S. Appl. No. 16/236,250—Unpublished Patent Application by Wei Zhou et al., titled "Methods and Systems for Manufacturing Semiconductor Devices", filed Dec. 28, 2018, 31 pages.

*Primary Examiner* — Calvin Y Choi
(74) *Attorney, Agent, or Firm* — Perkins Coie LLP

(57) ABSTRACT

A thermocompression bonding (TCB) apparatus can include a wall having a height measured in a first direction and configured to be positioned between a first pressing surface and a second pressing surface of a semiconductor bonding apparatus. The apparatus can include a cavity at least partially surrounded by the wall, the cavity sized to receive a semiconductor substrate and a stack of semiconductor dies positioned between the semiconductor substrate and the first pressing surface, the stack of semiconductor dies and semiconductor substrate having a combined unpressed stack height as measured in the first direction. In some embodiments, the unpressed stack height is greater than the height of the wall, and the wall is configured to be contacted by the first pressing surface to limit movement of the first pressing surface toward the second pressing surface during a semiconductor bonding process.

11 Claims, 11 Drawing Sheets

(56) References Cited

U.S. PATENT DOCUMENTS

2012/0252165 A1* 10/2012 Nakanoya ............... H01L 21/56
                                                               438/107
2018/0138070 A1*  5/2018 Hansen .................. H01L 24/83

* cited by examiner

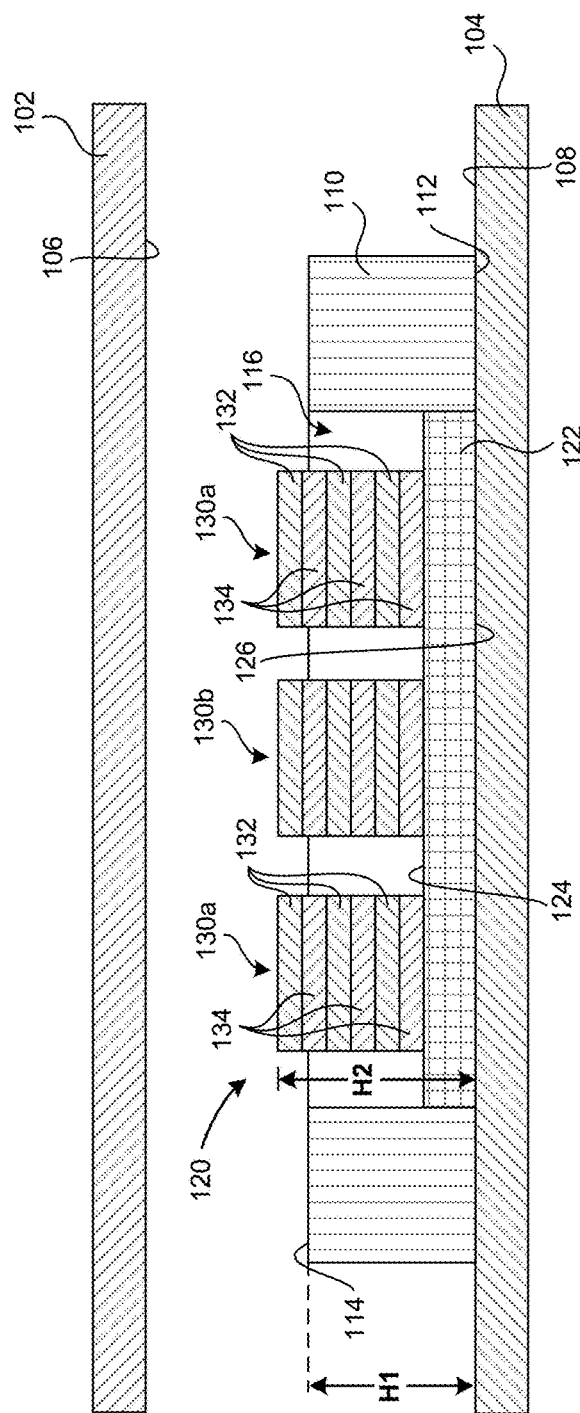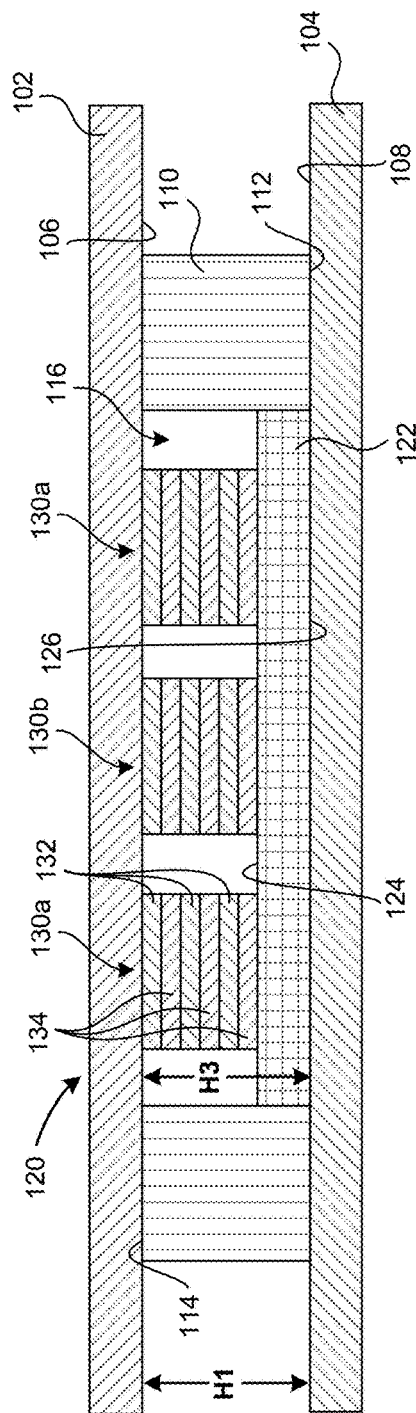
FIG. 2
FIG. 3

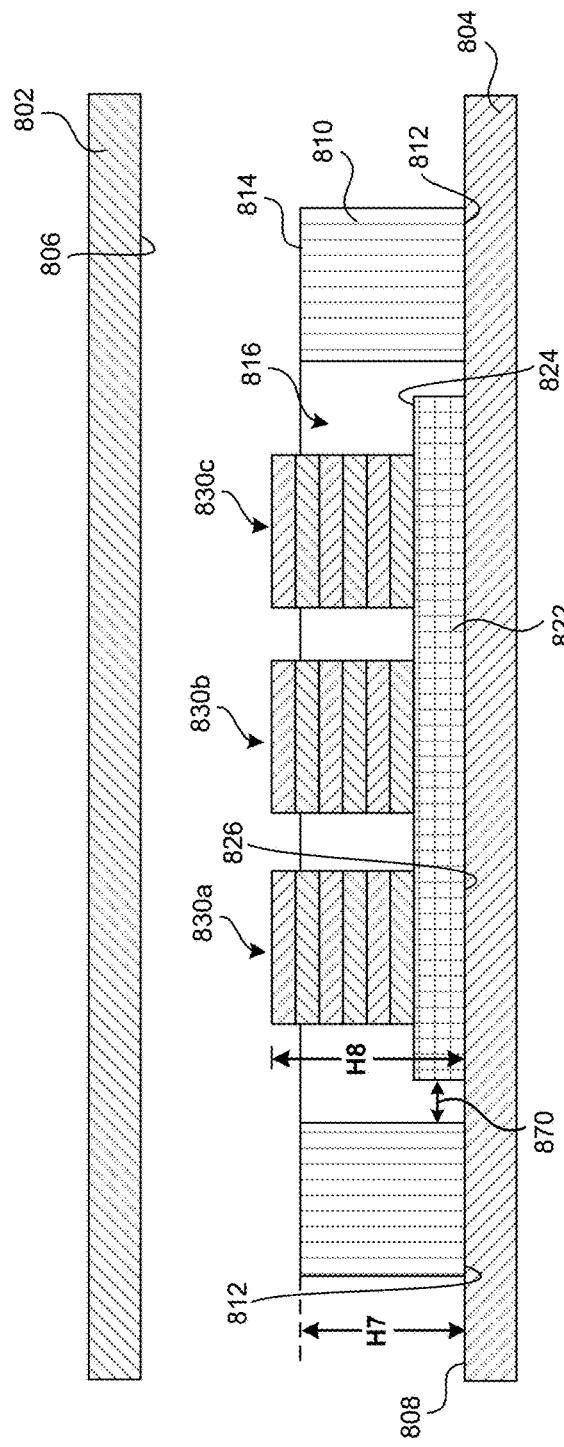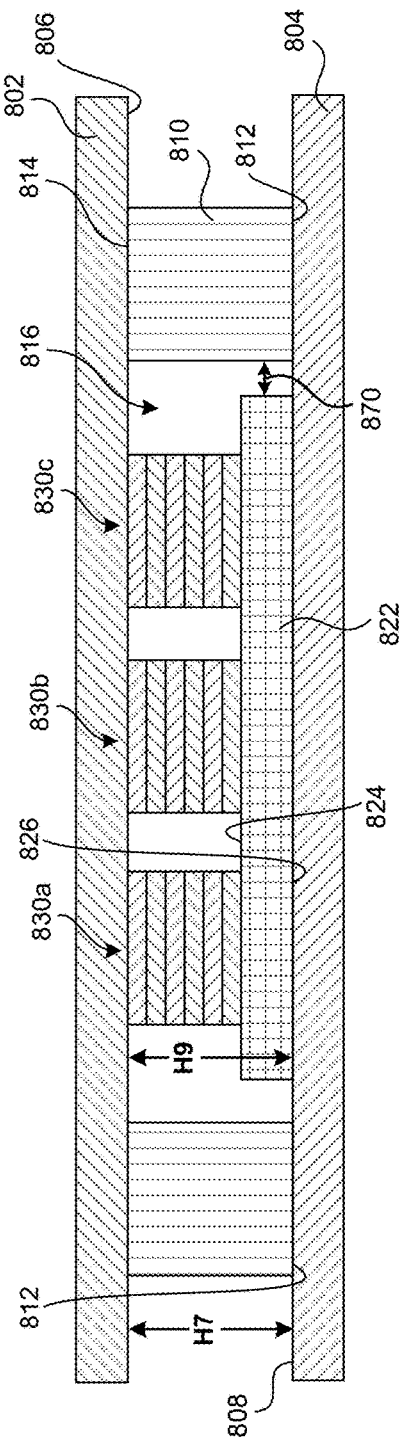

METHODS AND SYSTEMS FOR MANUFACTURING SEMICONDUCTOR DEVICES

CROSS-REFERENCE TO RELATED APPLICATIONS

This application contains subject matter related to an U.S. Patent Application by Wei Zhou et al, titled "METHODS AND SYSTEMS FOR MANUFACTURING SEMICONDUCTOR DEVICES." The related application is assigned to Micron Technology, Inc., and is identified as U.S. application Ser. No. 16/236,250, filed Dec. 28, 2018. The subject matter thereof is incorporated herein by reference thereto.

TECHNICAL FIELD

The present technology generally relates to semiconductor devices, and more particularly relates to methods and systems for manufacturing semiconductor devices.

BACKGROUND

Packaged semiconductor dies, including memory chips, microprocessor chips, and imager chips, typically include a semiconductor die mounted on a substrate and encased in a protective covering. The semiconductor die includes functional features, such as memory cells, processor circuits, and imager devices, as well as bond pads electrically connected to the functional features. The bond pads can be electrically connected to terminals outside the protective covering to allow the semiconductor die to be connected to higher level circuitry. Within some packages, semiconductor dies can be stacked upon and electrically connected to one another by individual interconnects between adjacent semiconductor dies. In such packages, each interconnect can include a conductive material (e.g., solder) and a pair of contacts on opposing surfaces of adjacent semiconductor dies. For example, a metal solder can be placed between the contacts and reflowed to form a conductive joint. Conventional processes, however, can cause the solder connections to malfunction.

BRIEF DESCRIPTION OF THE DRAWINGS

Many aspects of the present technology can be better understood with reference to the following drawings. The components in the drawings are not necessarily to scale. Instead, emphasis is placed on illustrating clearly the principles of the present technology.

FIG. 2 is a side cross-sectional view of an embodiment of a semiconductor die assembly positioned between two stages of a semiconductor bonding apparatus.

FIG. 3 is a side cross-sectional view of the semiconductor die assembly and semiconductor bonding apparatus of FIG. 2, wherein the die stacks are compressed between the two stages of the semiconductor bonding apparatus.

FIG. 14 is a side cross-sectional view of another embodiment of a semiconductor die assembly positioned between two stages of a semiconductor bonding apparatus.

FIG. 15 is a side cross-sectional view of the semiconductor die assembly and semiconductor bonding apparatus of FIG. 14, wherein the die stacks are compressed between the two stages of the semiconductor bonding apparatus.

DETAILED DESCRIPTION

Figure 1:
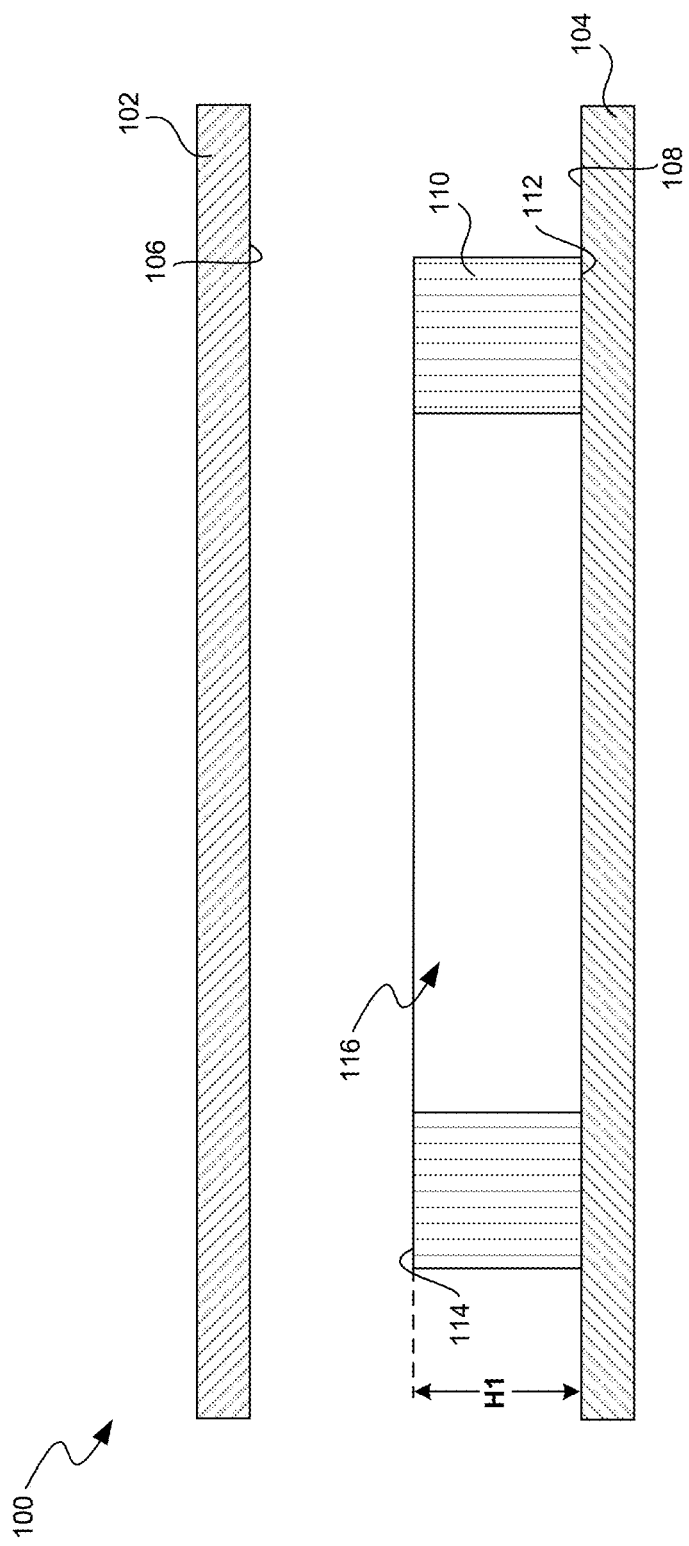
FIG. 1 is a side cross-sectional view of an embodiment of a semiconductor bonding apparatus.

One challenge with conventional semiconductor packages is controlling the compression of the die stacks during manufacturing. Often, all or a portion of a die stack is over-pressed during manufacture. Over-pressing of the die stacks can lead to various problems, including depletion of solder between pair of contacts, leakage of non-conductive film from the perimeter of the stacks, and undesired electrical shorting via leaked solder from adjacent pairs of contacts.

Specific details of several embodiments of semiconductor devices having spacer structures (e.g., stoppers) or other thermocompression bonding (TCB) apparatuses for limiting compression of solder or other bond material during a TCB operation or other die-stacking operation, and associated systems and methods, are described below. The structures and processes disclosed herein can also apply to other compression bonding methods in addition to TCB. A person skilled in the relevant art will recognize that suitable stages of the methods described herein can be performed at the wafer level or at the die level. Therefore, depending upon the context in which it is used, the term "substrate" can refer to a wafer-level substrate or to a singulated, die-level substrate. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, spin coating, and/or other suitable techniques. Similarly, materials can be removed, for example, using plasma etching, wet etching, chemical-mechanical planarization, or other suitable techniques. A person skilled in the relevant art will also understand that the technology may have additional embodiments, and that the technology may be practiced without several of the details of the embodiments described below with reference to FIGS. 1-18.

In several of the embodiments described below, a semiconductor manufacturing system includes a first press-stage having a first pressing surface, a second press-stage having a second pressing surface facing the first pressing surface, and a stopper (e.g., a TCB apparatus) positioned between the first press-stage and the second press-stage. The stopper can include at least one internal cavity. As illustrated in the various embodiments herein, a semiconductor substrate can be positioned between the first press-stage and the second press-stage, and a first stack of semiconductor dies can be connected to the semiconductor substrate. The first stack of semiconductor dies can be positioned at least partially within the internal cavity of the stopper between the semiconductor substrate and the first press-stage.

In some embodiments, the stopper is configured to limit movement of the first and second pressing surfaces toward each other thereby controlling compression of the first stack of the semiconductor to a desired thickness. Limiting the compression of the stack of semiconductor dies to a desired thickness can reduce the likelihood of squeezing excess solder or other bonding material out from the solder joint. Limiting compression can also reduce filleting of non-conductive film (NCF) or other material between the individual dies in the stack. These and other advantages of using the stopper can increase the yield of the TCB process by enhancing the speed and reliability of manufacturing hundreds, or even thousands, of die packages in a single stage.

As used herein, the terms "vertical," "lateral," "upper," and "lower" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation. The headings provided herein are for convenience only and should not be construed as limiting the subject matter disclosed.

FIG. 1 illustrates an embodiment of a semiconductor manufacturing system 100. As illustrated, the manufacturing system 100 can include an upper (e.g., first) press-stage 102 and a lower (e.g., second) press-stage 104. The upper press-stage 102 can include a first pressing surface 106 facing the second press-stage 104. Similarly, the lower press-stage 104 can include a second pressing surface 108 facing the upper press-stage 102. In some embodiments, at least one of the first and second press-stages 102, 104 are positioned within a cavity of a bonding apparatus. In some embodiments, the first and second press-stages 102, 104 have substantially equal cross-sectional areas as measured parallel to the first pressing surface 106.

The system 100 can include a stopper 110 between the two press-stages 102, 104. The stopper 110 can include a first side 112 and a second side 114 opposite the first side 112. In the illustrated embodiments, the first side 112 of the stopper 110 contacts the second press-stage 104 (e.g., the second pressing surface 108 of the second press-stage 104). The opposite arrangement, wherein the second surface 114 contacts the second press-stage 104, may also be employed.

At least one of the first and second sides 112, 114 of the stopper 110 can be planar. In some embodiments, at least one of the first and second sides 112, 114 includes one or more indentations, holes, undulations, ribs, channels, protrusions, and/or other surface features. Preferably, the first and second sides 112, 114 are sized and shaped such that a planar rigid structure will rest in a horizontal plane when the planar rigid structure is set upon the stopper 110 and the stopper 110 is set upon a horizontal surface.

The stopper 110 can have a height (e.g., a max height) H1 as measured from and normal to the second pressing surface 108 when the stopper 110 is on the second pressing surface 108. As illustrated, the stopper 110 includes at least one internal cavity 116. The internal cavity 116 can extend through the height H1 of the stopper 110. In some embodiments, as explained below, the stopper 110 includes a plurality of cavities 116.

In some embodiments, the stopper 110 can be constructed from a rigid, semi-rigid, and/or resilient material. Preferably, the stopper 110 is constructed from a material configured to withstand high temperature gradients often used in a TCB operation. One such material can be silicon. For example, a silicon wafer may be cut to the desired height and width, with the desired cavity or cavities cut through the wafer. Other materials, including metals, ceramics, polymers, semiconductors, and/or other materials or combinations of materials may be used to construct the stopper 110.

As illustrated in FIG. 2, a semiconductor assembly 120 can be positioned within the cavity 116 of the stopper 110. The semiconductor assembly 120 includes a substrate 122. Preferably, the cavity 116 is sized and shaped such that the substrate 122 is inhibited or prevented from moving in a direction perpendicular to the height H1 of the stopper 110 when the substrate 122 is positioned within the cavity 116. For example, the cavity 116 can have substantially the same cross-sectional area as the substrate 122 when measured in a plane perpendicular to the height H1 of the stopper 110. In some embodiments, the cavity 116 has substantially the same cross-section as a plurality of substrates 122 to be positioned within the cavity 116 at the same time. Inhibiting or preventing the substrate 122 from moving laterally (e.g., perpendicular to the height H1 of the stopper 110) can increase the reliability of the manufacturing process and reduce the likelihood of manufacturing errors due to misalignment or movement of the semiconductor assemblies 120.

The substrate 122 can have a first surface 124 and a second surface 126 opposite the surface 124. Preferably, at least one of the first and second surfaces 124, 126 of the substrate 122 are planar. In the illustrated embodiments, all or portions of each of the first and second surfaces 124, 126 of the substrate 122 are parallel to each other.

Figure 4:
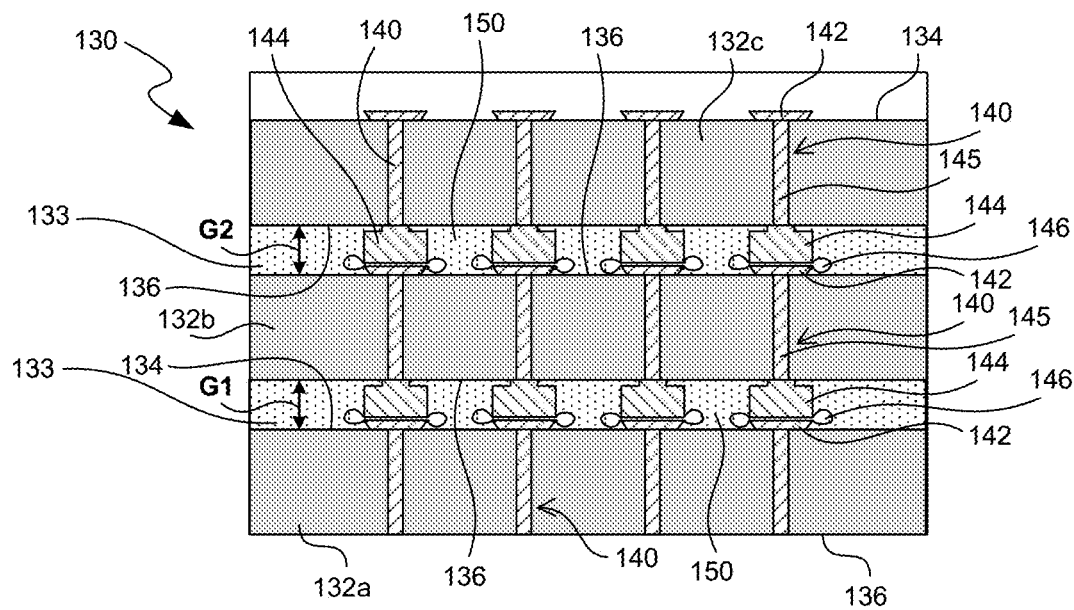
FIG. 4 is a side close up cross-sectional view of the TSVs and solder connections of a semiconductor die assembly without a stopper.

One or more die stacks may be positioned on the substrate 122. In the illustrated example, a first die stack 130a, a second die stack 130b, and a third die stack 130c (collectively, "die stacks 130") are each positioned on the first surface 124 of the substrate 122. Each die stack 130 can include dies 132 stacked on each other and attached together by an adhesive 133 (FIG. 4). The adhesive 133 is between the individual dies 132 and the lowest die 132 and the substrate 122. The adhesive 133, for example, can be an uncured or partially cured underfill material. The die stacks 130 can have an initial (e.g., pre-pressed) height H2 as measured from and normal to the second pressing surface 108 when the substrate 122 is positioned on the second pressing surface 108. In some embodiments, the initial height H2 of each individual die stack 130 may vary. The initial heights H2 of the die stacks 130 are generally greater than the height H1 of the stopper 110. Although, in some embodiments, some of the die stacks 130 may have a height H2 equal to or less than the height H1.

FIG. 3 illustrates the manufacturing system 100 and semiconductor assembly 120 after a TCB operation. As illustrated, the first press-stage 102 is moved toward the second press-stage 104 until the first pressing surface 106 contacts the stopper 110. Moving the first press-stage 102 into contact with the stopper 110 compresses the die stacks 130 to a desired (e.g., compressed) height H3 with respect to the second pressing surface 108 that securely fixes the dies 132 and substrate 122 together. As illustrated, the compressed height H3 of the die stacks 130 is substantially equal to the height of the stopper 110.

The stopper 110 is expected to provide controlled compression of the die stacks 130 wherein the level of compression, as reflected in the controlled compressed height H3, is limited to reduce or eliminate over-compression of the die stacks 130. Avoiding over-compression of the die stacks 130 can result in improvement to the overall semiconductor manufacturing process, as some known manufacturing defects can be reduced or eliminated. Additionally, the stopper is expected to enable faster compression times and thereby increase the throughput of manufacturing packaged semiconductor devices.

FIG. 4 illustrates one such manufacturing defect that can occur in the absence of a stopper. More specifically, FIG. 4 illustrates a portion of a die stack 130 that has been compressed via a TCB operation without a stopper. The illustrated die stack 130 includes a first semiconductor die 132a, a second semiconductor die 132b adjacent to (e.g., stacked over) the first semiconductor die 132a, and a third semiconductor die 132c adjacent to (e.g., stacked over) the second semiconductor die 132b. The semiconductor dies (collectively semiconductor dies 132) each include a first (e.g., upper) surface 134 and a second (e.g., lower) surface 136 opposite the first surface 134. The die stack 130 also includes an array of individual interconnects 140 extending vertically between the first surface 134 of the first semiconductor die 132a and the second surface 136 of the second semiconductor die 132b. One or more of the individual interconnects can include a first conductive feature (e.g., a conductive pad 142) on end and a second conductive feature (e.g., a conductive pillar 144) on a second end. In the illustrated embodiment, the interconnects 140 each include a conductive pad 142 on the first surface 134 of the first semiconductor die 132a, a conductive pillar 144 on the second surface 136 of the second semiconductor die 132b, a through silicon via (TSV) 145 extending through the semiconductor material of the wafer 132 between the conductive pad 142 and the conductive pillar 144, and a bond material (e.g., solder, tin-silver, or other bond material) 146 bonding the conductive pillar 144 to the conductive pad 142. In some embodiments, the die stack 130 can include a smaller or greater number of interconnects 140 than shown in FIG. 4. For example, the die stack 130 can include tens, hundreds, thousands, or more interconnects 140 arrayed between the semiconductor dies 132.

In some embodiments, the interconnects 140 have a total height or thickness of between about 20-35 μm. In certain embodiments, the conductive pillars 144 have a thickness of between about 10-30 μm (e.g., about 18 μm) and the conductive pads 142 have a thickness of between about 1-5 μm (e.g., about 4 μm).

In the configuration illustrated in FIG. 4, the individual semiconductor dies 132a, 132b, 132c are spaced apart from each other by gaps G1, G2 that are generally filled by the adhesive 133. In some embodiments, the gaps G1, G2 between the semiconductor dies 132 are not uniform. For example, the gap G1 between the first and second semiconductor dies 132a, 132b can be greater than or less than the gap G2 between the second and third semiconductor dies 132b, 132c. The adhesive 133, which can be a nonconductive film (NCF) 150, may be distributed in the gaps G1, G2. In some embodiments, the NCF 150 is used to pre-tack one or more of the semiconductor dies 132 to the substrate 122 and the remaining semiconductor dies 132 to each other.

As illustrated in FIG. 4, TCB processing can result in over-compression of the bond material 146 between the interconnects 140 without a stopper 110. Such over-compression of the bond material 146 can lead to squeezing too much of the bond material 146 from between the conductive pillars 144 and corresponding conductive pads 142 (e.g., known as "squeeze-out"). The squeezed-out material 146 in one interconnect can spread into contact with squeezed-out material 146 in another, adjacent interconnect. Such contact can lead to undesirable electrical connections, such as shorting, within the die stack 130. However, the squeezed-out materials may not need to physically contact each other to impair performance because in some embodiments merely being too close to each other can create interference that impairs electrical operation of a device. In some applications, over-compression of the die stack 130 can also lead to undesirable filleting of the NCF 150 from between the individual dies 132 and/or from between the die stack 130 and the substrate 122. Filleting of the NCF 150 can increase the footprint of the die stack 130 on the substrate 122 and reduce the number of die stacks 130 that may be manufactured on a given substrate 122.

Figure 5:
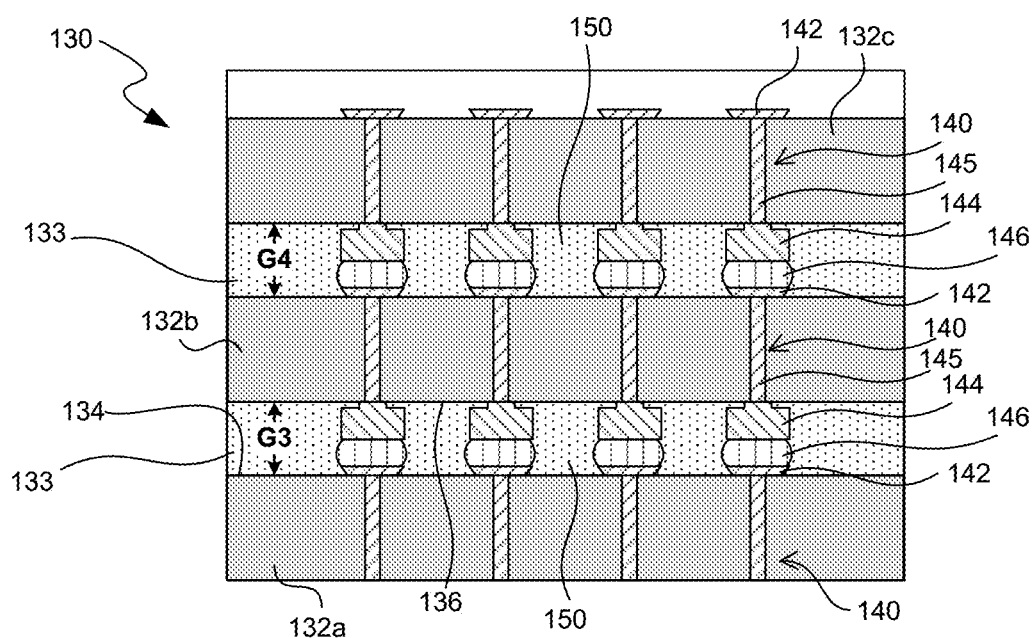
FIG. 5 is a side close up cross-sectional view of the TSVs and solder connections of a semiconductor die assembly having a stopper.

FIG. 5 illustrates a semiconductor die stack 130 formed with a TCB operation used with a stopper in accordance with the present technology. As illustrated, the bond material 146 is not over-compressed when a stopper is used during the TCB operation. On the contrary, a sufficient portion of the bond material 146 remains between the corresponding conductive pillars 144 and conductive pads 142 with little or no squeeze-out. The height of the bond material 146, as measured parallel to the gaps G3, G4, can be maintained at a minimum value of at least 1 μm, at least 2 μm, at least 3 μm, at least 4 μm, at least 6 μm, and/or at least 8 μm (or any value between 1-8 μm, or 2 μm-6 μm, or 3 μm-5 μm). The gap G3 between the first and second semiconductor dies 132a, 132b of FIG. 5 is greater than either of the gaps G1, G2 between the semiconductor dies 132a, 132b, 132c in FIG. 4. In some embodiments, the gap G4 between the second and third semiconductor dies 132b, 132c of FIG. 5 is also greater than either of the gaps G1, G2 between the semiconductor dies 132a, 132b, 132c in FIG. 4. In some embodiments, the height H1 (FIG. 2) of the stopper 110 is selected to maintain a desired average gap between the semiconductor dies 132 in a given semiconductor die stack 130. For example, the height H1 of the stopper 110 can be approximately equal to the sum of the following: (a) the height of the substrate 122; (b) the cumulative height of the individual semiconductor dies 132; and (c) the desired gap size multiplied by the number of gaps (e.g., one less than the number of semiconductor dies). In some applications, the natural compression resistance of the bond material 146 and/or the NCF 150 can help to maintain relative uniformity of the gaps between the semiconductor dies 132 when a stopper 110 is used. Maintaining desired gap widths between the semiconductor dies 132 and the desired thicknesses for the bonding material 146 between the interconnects of the semiconductor dies 132 allows for fewer manufacturing defects associated with bonding material squeeze-out and/or misalignment/tilting between the semiconductor dies 132. The lack of over-compression can also allow for fewer misalignments (e.g., tilting) between the individual dies 132 in the die stacks 130.

Figure 6:
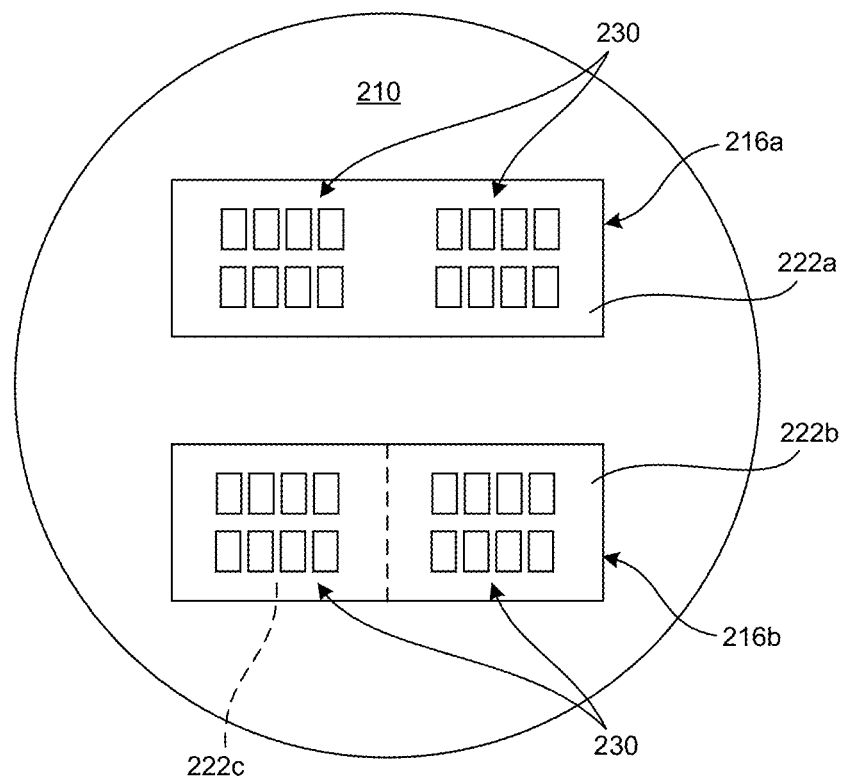
FIGS. 6-10 are top plan views of various embodiments of semiconductor die assemblies.

FIGS. 6-10 illustrate various embodiments of semiconductor die assemblies and semiconductor manufacturing assemblies. As illustrated, various semiconductor die assembly shapes and sizes may be employed with various stoppers. For example, as illustrated in FIG. 6, the stopper 210 may include two or more cavities 216a, 216b. The cavities 216a, 216b may be the same size and/or shape. In some embodiments, the first cavity 216a has a larger or smaller cross-sectional area (e.g., the area shown in plan view in FIG. 6) than the second cavity 216b. The cavities 216a, 216b can be sized to receive first and second substrates 222a, 222b, respectively. The substrates 222a, 222b can each be sized and shaped to have cross-sections substantially identical to the cross-sections of the cavities 216a, 216b.

In some embodiments, as illustrated, two or more substrates may be positioned within a single cavity. For example, the second substrate 222b may, in fact, be two separate substrates (e.g., resulting in a third substrate 222c identified by broken lines). The combined cross-sectional shapes of the two or more substrates positioned in the second cavity 216b may be substantially identical to the cross-sectional shape of the cavity 216b. In some embodiments, as explained above, the cross-sectional shapes (e.g., or combined cross-sectional shapes) of the substrates 222 may be selected to inhibit or prevent rotation of the substrate 222 within a cavity 216, even if the respective cross-sectional shapes of the substrates and cavities are not identical or substantially identical to each other. The overall outer shape of the stopper 210 can be circular (FIGS. 6-9), polygonal (FIG. 10), oval-shaped, and/or some combination thereof.

Each of the substrates 222 can be configured to accommodate one or more semiconductor die stacks 230. The stacks 230 can be arranged in rows and/or columns on each of the substrates 222. In some embodiments, each of the substrates 222 can be configured to accommodate the same number of die stacks 230. In some embodiments, at least one of the substrates 222 is configured to accommodate a different number of stacks 230 as compared to one or more other substrates 222.

Figure 7:
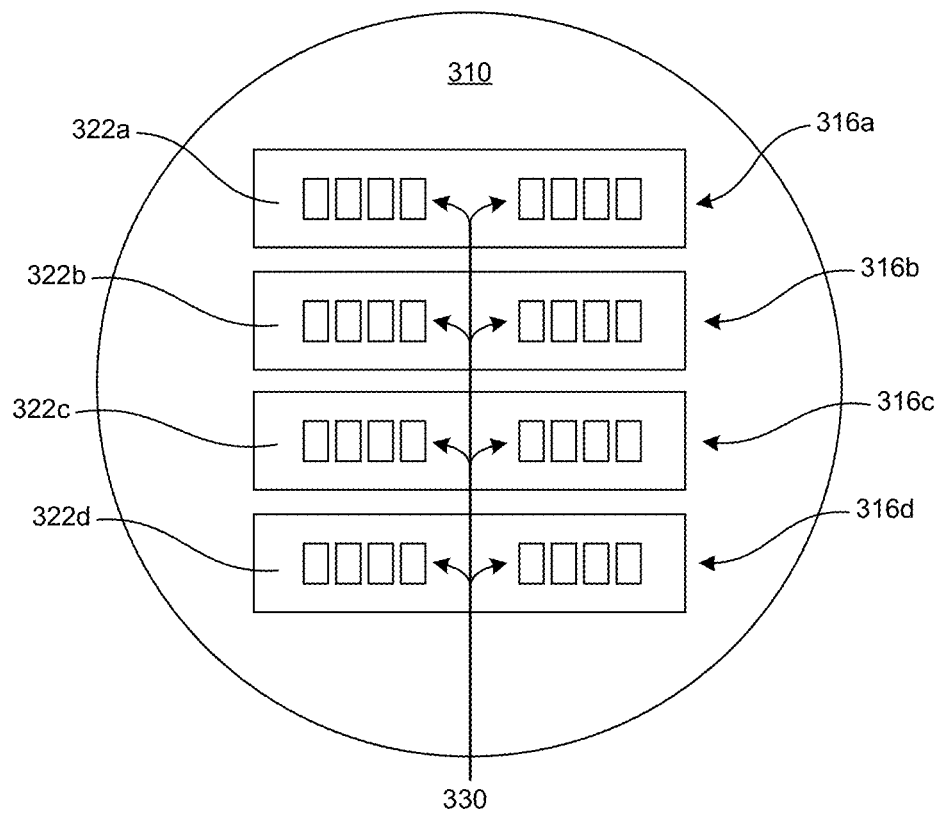

FIG. 7 illustrates an embodiment of a stopper 310 having more cavities than the stopper 210 of FIG. 6 (e.g., four cavities 316a, 316b, 316c, 316d). The cavities 316 of the stopper 310 can be smaller than the cavities 216 of the stopper 210. In some embodiments, the cavities 316 of the stopper 310 are configured to accommodate smaller substrates 322a, 322b, 322c, 322d than the substrates 222 used in the stopper 210. In some embodiments, the accumulative cross-sectional areas of the cavities 316 of the stopper 310 are approximately equal to the accumulative cross-sectional areas of the cavities 216 of the stopper 210. In some embodiments, the accumulative cross-sectional areas of the cavities 316 of the stopper 310 are greater than or less than the accumulative cross-sectional areas of the cavities 216 of the stopper 210. In some embodiments, the overall number of semiconductor die stacks 330 configured to be positioned on the substrates 322 in FIG. 7 is equal to the overall number of semiconductor die stacks 230 configured to be positioned on the substrates 222 in FIG. 6. In some embodiments, the overall number of semiconductor die stacks 330 configured to be positioned on the substrates 322 in FIG. 7 is greater than or less than the overall number of semiconductor die stacks 230 configured to be positioned on the substrates 222 in FIG. 6.

Figure 8:
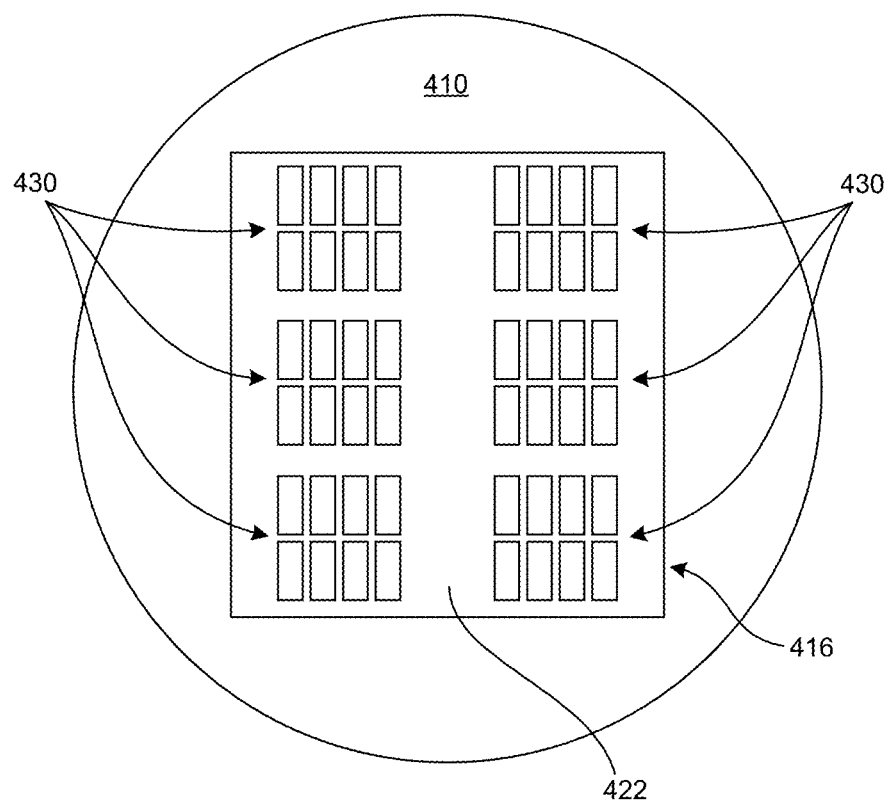

FIG. 8 illustrates an embodiment of a stopper 410 having a single cavity 416. The single cavity 416 may be larger than the cavities 216, 316 described above. In some embodiments, the cross-sectional area of the cavity 416 is approximately the same as the accumulative cross-sectional area of the cavities 316 of the stopper 310. In some embodiments, the cross-sectional area of the cavity 416 is greater than or less than the accumulative cross-sectional area of the cavities 316 of the stopper 310. The single cavity 416 of the stopper 410 can be configured to receive a single, large substrate 422 having at least one semiconductor die stack 430 thereon. In some embodiments, multiple substrates are positioned within the cavity 416.

Figure 9:
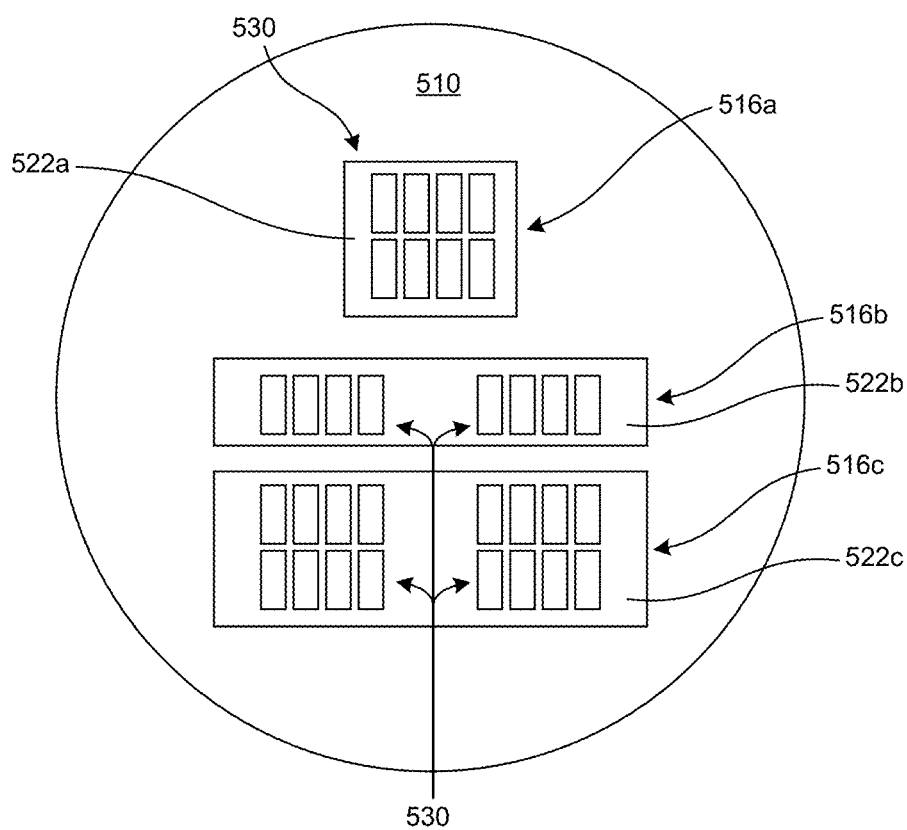

FIG. 9 illustrates an embodiment of a stopper 510 that includes cavities of varying sizes and shapes. For example, a first cavity 516a of the stopper 510 can have a lower aspect ratio, as observed from above, than a second cavity 516b. In some embodiments, one or both of the first and second cavities 516a, 516b are smaller than a third cavity 516c.

Figure 10:
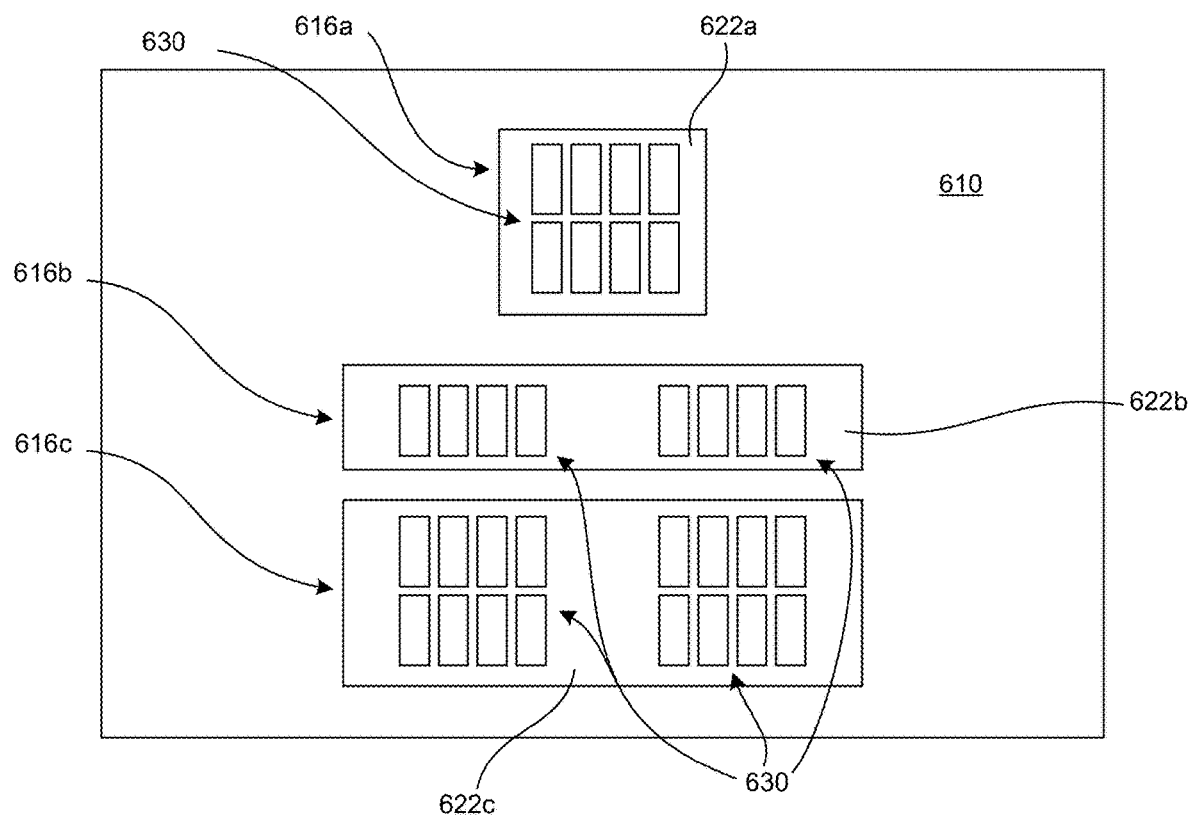

FIG. 10 illustrates an embodiment of a stopper 610 having a non-circular outer perimeter (e.g., overall shape). In the illustrated example, the stopper 610 has a rectangular outer perimeter. Other outer perimeter shapes, including polygons, oval-shapes, circles, or some combination thereof may be used. As illustrated, the cavities 616a, 616b, 616c of the stopper 610 can be similar to or the same as the cavities 516 of the stopper 510. In some embodiments, the cavities 616 of the stopper 610 are different in size and/or shape from the cavities 516 of the stopper 510.

Figure 11:
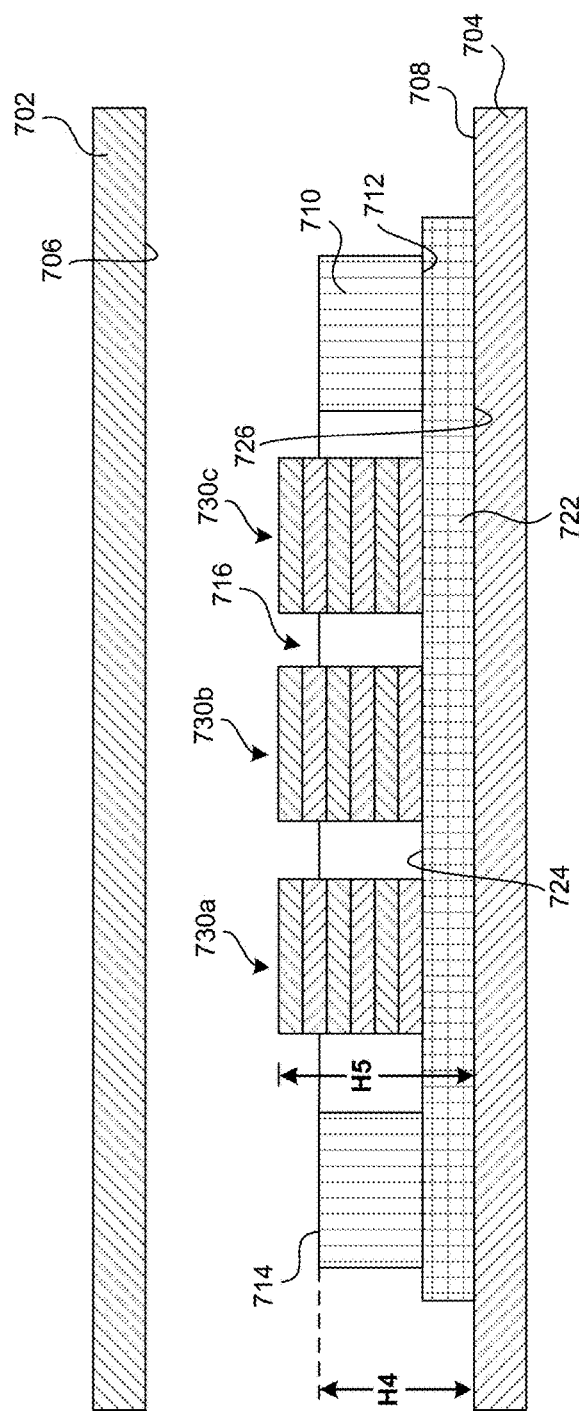
FIG. 11 is a side cross-sectional view of another embodiment of a semiconductor die assembly positioned between two stages of a semiconductor bonding apparatus.
Figure 12:
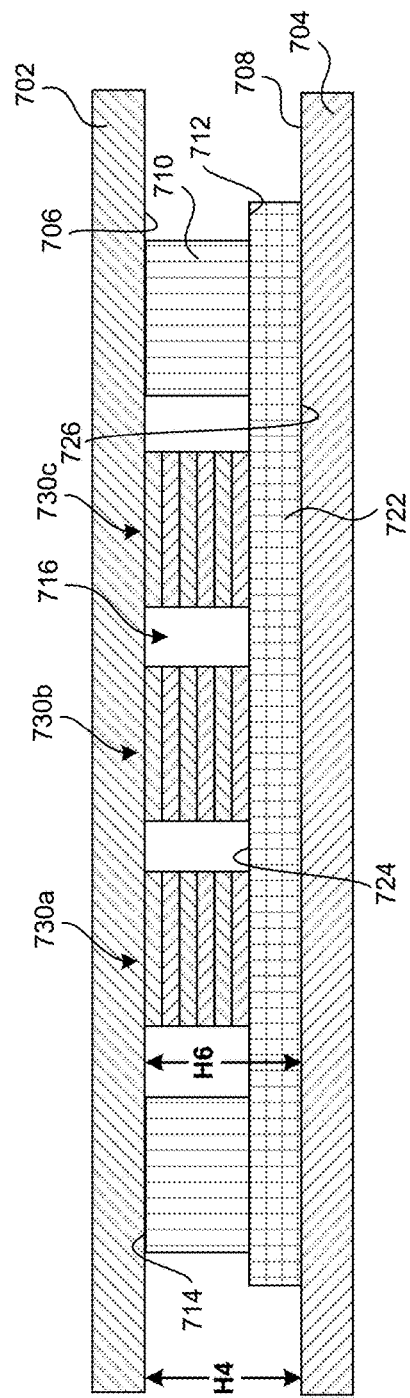
FIG. 12 is a side cross-sectional view of the semiconductor die assembly and semiconductor bonding apparatus of FIG. 11, wherein the die stacks are compressed between the two stages of the semiconductor bonding apparatus.
Figure 13:
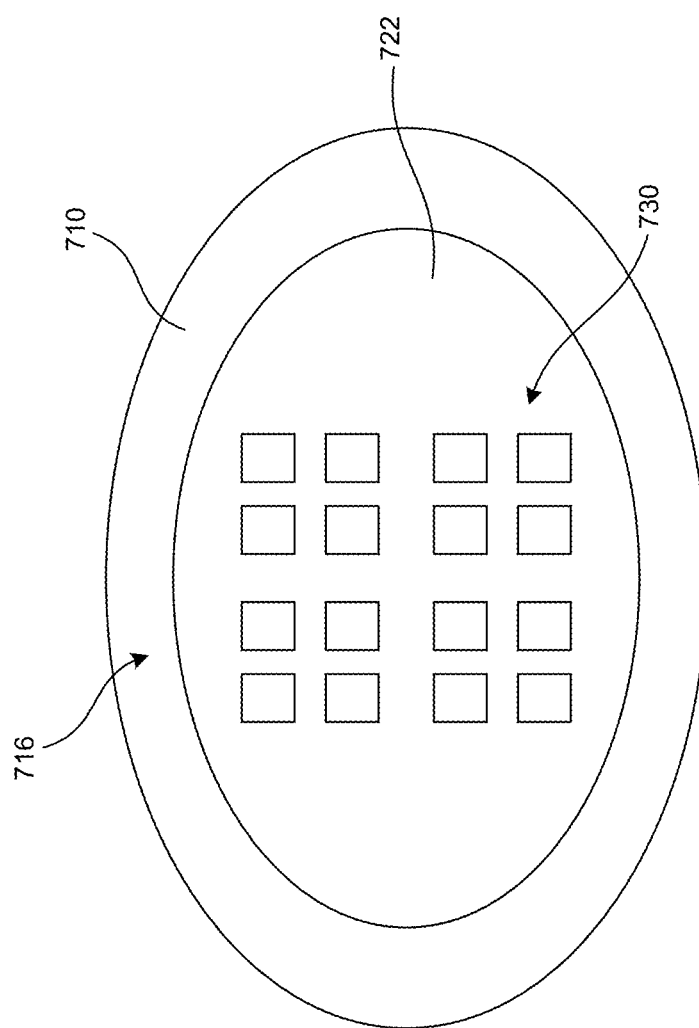
FIG. 13 is a top plan view of an embodiment of a semiconductor die assembly.

FIGS. 11-13 illustrate an embodiment of a semiconductor manufacturing system 700 similar to the manufacturing system 100 described above. Unless otherwise described, like reference numbers (e.g., numbers that share the same last two digits) correspond to structures that are the same or similar in structure and/or function between the systems 100 and 700 (e.g., the upper press-stage 702 v. the upper press-stage 102).

As illustrated, the stopper 710 of the semiconductor manufacturing system 700 is on the substrate 722. More specifically, the stopper 710 is on the first surface 724 of the substrate 722, opposite the second press-stage 704. The stopper 710 can be constructed in the same or a similar manner with same or similar materials to the stopper 110 described above. The height of the stopper 710 can be selected such that the cumulative height H4 of the stopper 710 and substrate 722 limits the extent to which the first press-stage 702 is able to move toward the second press-stage 704 and thereby limits the amount of compression applied to the die stacks 730 during a TCB operation. For example, the stopper 710 limits the compressed height H6 (FIG. 12) of the die stacks 730 and substrate 722 to reduce or eliminate the squeeze-out problems described above. As illustrated, the uncompressed height H5 of the die stacks 730 is greater than the cumulative height H4 of the stopper 710 and substrate 722, while the compressed height H6 of the die stacks is equal to the height H4.

By positioning the stopper 710 upon the substrate 722, existing manufacturing systems 700 can be easily retrofitted to use a stopper system. For example, since the stopper 710 is on the substrate 722, press-stages 702, 704 limited to receiving the footprint of the substrate 722 can still be used without having the change the size of the press-stages 702, 704.

In some embodiments, the stopper 710 is configured in the manner illustrated in FIGS. 11-13 to use the stopper 710 with a wafer substrate 722. The wafer substrate 722 can be constructed from silicon or other material. The stopper 710 can be positioned on the wafer substrate 722 before starting a TCB operation and before other processing of the wafer. For example, TCB operations using the stopper 710 can be performed before wafer dicing or other wafer processing.

In some embodiments, using one or more stoppers 710 on one or more substrates 722 can facilitate control of compression (e.g., control of movement of the press-stages 702, 704 toward each other) for die stacks 730 positioned both within cavities 716 of the stoppers 710 and outside of the cavities 716. More specifically, the compression control provided by the stopper 710 can limit the overall movement of the press-stages 702, 704 toward each other, thereby limiting compression of die stacks located both within the cavity 716 of the stopper 710 and outside the cavity 716 of the stopper. In some embodiments, the stopper 710 can be used to concurrently limit compression of at least ten die stacks, at least twenty die stacks, at least forty die stacks, at least seventy-five die stacks, and/or at least one hundred fifty die stacks in a single TCB or other compression operation. FIG. 13 provides a top view of a semiconductor manufacturing system utilizing a stopper 710 positioned on a substrate 722.

FIGS. 14-15 illustrate an embodiment of a semiconductor manufacturing system 800 similar to the manufacturing system 100 described above. Unless otherwise described, like reference numbers (e.g., numbers that share the same last two digits) correspond to structures that are the same or similar in structure and/or function between the systems 100 and 800 (e.g., the upper press-stage 102 v. the upper press-stage 802). As illustrated, the cavity 816 of the stopper 810 can be larger than the substrate 822, thereby providing a gap 870 between an outer edge (e.g., as measured parallel to the first surface 824 of the substrate 822) of the substrate 822 and an inner edge (e.g., as measured parallel to the first surface 812 of the stopper 810) of the cavity 816. In some embodiments, the stopper 810 is used in combination with substrates 822 (e.g., wafers) having outer perimeters that are smaller than the inner perimeter of the stopper 810. For example, the stopper 810 may be used with wafers that are not yet cut to a precise shape or size.

Similar to the embodiments described above, the die stacks 830 have an initial height H8 greater than the height H7 of the stopper 810 and a compressed height H9 approximately equal to the height H7 of the stopper 810.

Figure 16:
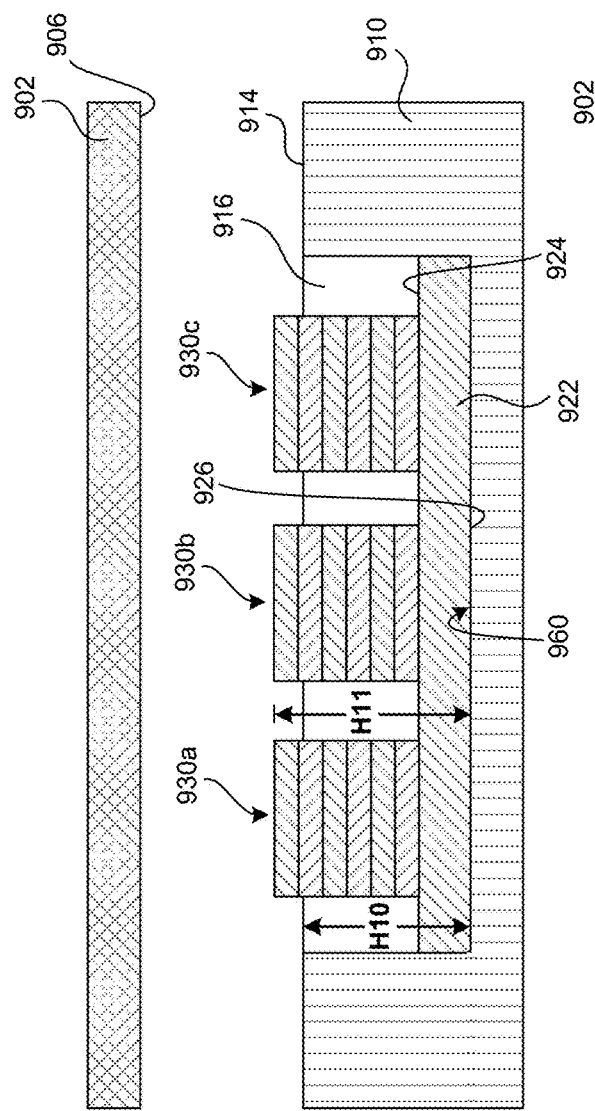
FIG. 16 is a side cross-sectional view of another embodiment of a semiconductor die assembly positioned between two stages of a semiconductor bonding apparatus.
Figure 17:
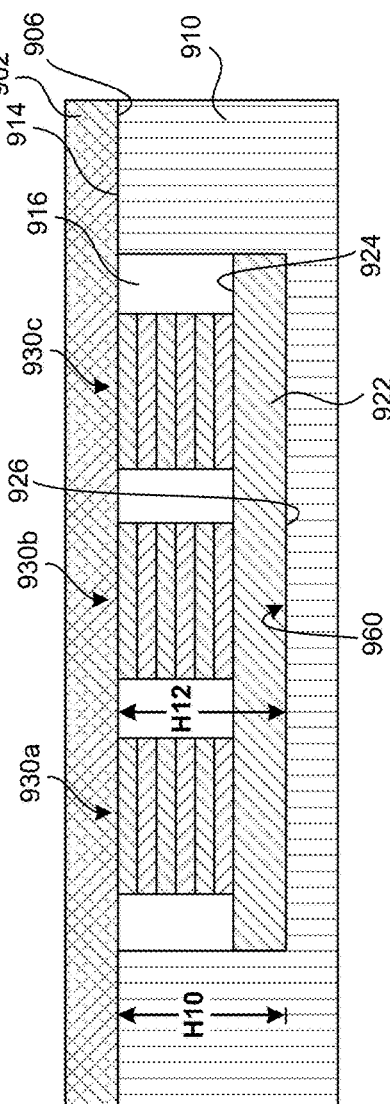
FIG. 17 is a side cross-sectional view of the semiconductor die assembly and semiconductor bonding apparatus of FIG. 16, wherein the die stacks are compressed between the two stages of the semiconductor bonding apparatus.

In some embodiments, as illustrated in FIGS. 16-17, the stopper can be formed integrally with the first and/or second press-stages. In some such embodiments, a stopper (e.g., a lip, ridge, or other structure) is formed on both of the first and second press-stages. In the illustrated embodiment, a cavity 916 is formed in the second (e.g., lower) press-stage 904. The cavity 916 can have a similar size and shape to the cavities in the stopper described above. The cavity 916 can include a floor or surface 960 on which a substrate 922 is configured to rest. The cavity 916 can be surrounded by a wall (e.g., stopper) 910. In some embodiments, the wall 910 is annular and/or continuous around a perimeter of the cavity 916.

As illustrated, the initial or uncompressed height H11 of the die stacks 930 as measured from and perpendicular to the floor 960 is greater than the height H10 of the wall 910 as measured from the floor 960. The compressed height H12 (e.g., the height at the end of a TCB operation) is equal to or approximately equal to the height H10 of the wall 910.

Figure 18:
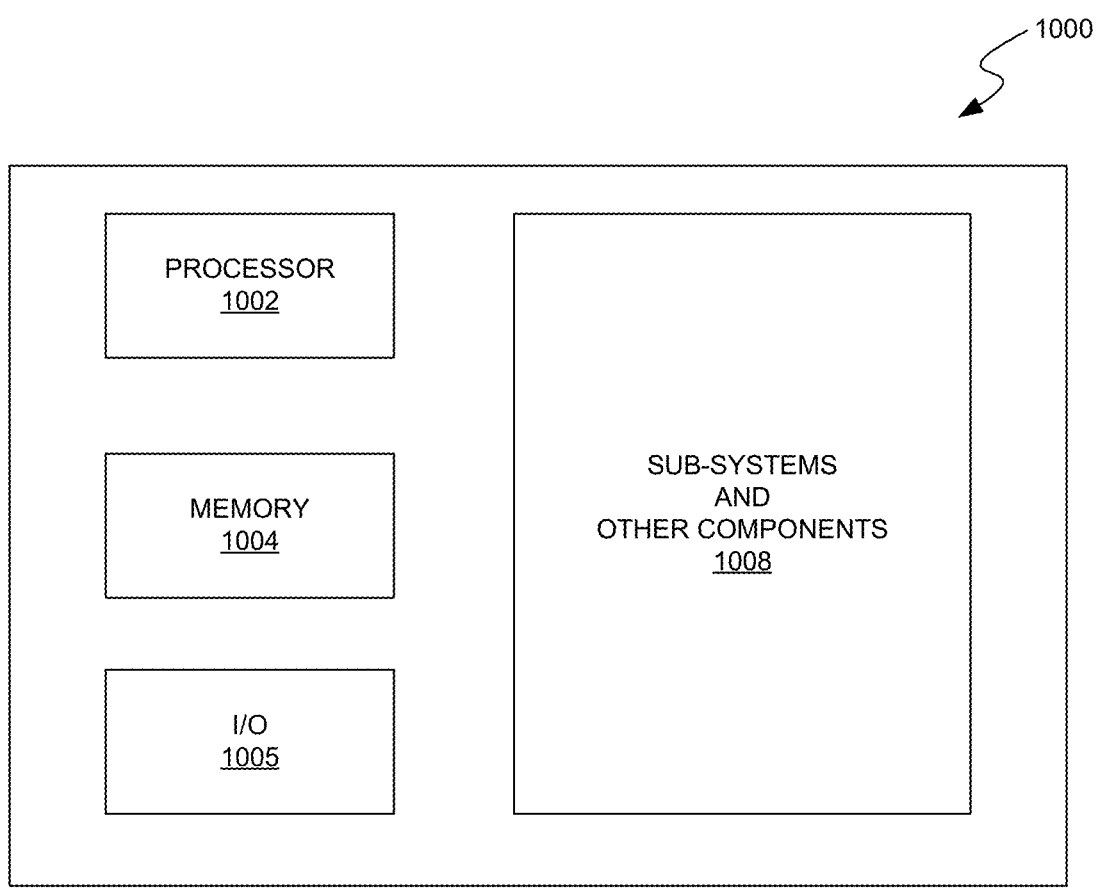
FIG. 18 is a schematic view of a system that includes a semiconductor device configured in accordance with embodiments of the present technology.

Any one of the semiconductor devices having the features described above (e.g., with reference to FIGS. 1-17) can be incorporated into any of a myriad of larger and/or more complex systems, a representative example of which is system 1000 shown schematically in FIG. 18. The system 1000 can include a processor 1002, a memory 1004 (e.g., SRAM, DRAM, flash, and/or other memory devices), input/output devices 1005, and/or other subsystems or components 1008. The semiconductor dies and semiconductor die assemblies described above can be included in any of the elements shown in FIG. 18. The resulting system 1000 can be configured to perform any of a wide variety of suitable computing, processing, storage, sensing, imaging, and/or other functions. Accordingly, representative examples of the system 1000 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system 1000 include lights, cameras, vehicles, etc. With regard to these and other examples, the system 1000 can be housed in a single unit or distributed over multiple interconnected units, e.g., through a communication network. The components of the system 1000 can accordingly include local and/or remote memory storage devices and any of a wide variety of suitable computer-readable media.

The above detailed descriptions of embodiments of the technology are not intended to be exhaustive or to limit the technology to the precise form disclosed above. Although specific embodiments of, and examples for, the technology are described above for illustrative purposes, various equivalent modifications are possible within the scope of the technology, as those skilled in the relevant art will recognize. For example, while steps are presented in a given order, alternative embodiments may perform steps in a different order. Moreover, the various embodiments described herein may also be combined to provide further embodiments. Reference herein to "one embodiment," "an embodiment," or similar formulations means that a particular feature, structure, operation, or characteristic described in connection with the embodiment can be included in at least one embodiment of the present technology. Thus, the appearances of such phrases or formulations herein are not necessarily all referring to the same embodiment.

Certain aspects of the present technology may take the form of computer-executable instructions, including routines executed by a controller or other data processor. In some embodiments, a controller or other data processor is specifically programmed, configured, and/or constructed to perform one or more of these computer-executable instructions. Furthermore, some aspects of the present technology may take the form of data (e.g., non-transitory data) stored or distributed on computer-readable media, including magnetic or optically readable and/or removable computer discs as well as media distributed electronically over networks. Accordingly, data structures and transmissions of data particular to aspects of the present technology are encompassed within the scope of the present technology. The present technology also encompasses methods of both programming computer-readable media to perform particular steps and executing the steps.

Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Where the context permits, singular or plural terms may also include the plural or singular term, respectively. Additionally, the term "comprising" is used throughout to mean including at least the recited feature(s) such that any greater number of the same feature and/or additional types of other features are not precluded. Directional terms, such as "upper," "lower," "front," "back," "vertical," and "horizontal," may be used herein to express and clarify the relationship between various elements. It should be understood that such terms do not denote absolute orientation. Further, while advantages associated with certain embodiments of the technology have been described in the context of those embodiments, other embodiments may also exhibit such advantages, and not all embodiments need necessarily exhibit such advantages to fall within the scope of the technology. Accordingly, the disclosure and associated technology can encompass other embodiments not expressly shown or described herein.

We claim:

1. A semiconductor manufacturing system comprising:
a first press-stage having a first pressing surface;
a second press-stage having a second pressing surface facing the first pressing surface;
a stopper positioned between the first press-stage and the second press-stage, the stopper comprising at least one internal cavity and a continuous wall surrounding the at least one internal cavity;
a semiconductor substrate positioned between the first press-stage and the second press-stage;
a first stack of semiconductor dies connected to the semiconductor substrate, the first stack of semiconductor dies positioned at least partially within the at least one internal cavity of the stopper between the semiconductor substrate and the first press-stage;
wherein the stopper is configured to limit movement of the first and second pressing surfaces toward each other to limit compression of the first stack of semiconductor dies to a desired thickness.

2. The semiconductor manufacturing system of claim 1, wherein the first stack of semiconductor dies comprises a first die positioned closest to the semiconductor substrate, and a last die positioned furthest from the semiconductor substrate, and wherein at least a portion of the last die is positioned beyond the stopper in a direction toward the first pressing surface before movement of the first and second pressing surfaces toward each other.

3. The semiconductor manufacturing system of claim 1, wherein the stopper is formed integrally with the second stage.

4. The semiconductor manufacturing system of claim 1, wherein the stopper comprises a second cavity, the system further comprising a second stack of semiconductor dies connected to a semiconductor substrate and positioned at least partially within the second cavity of the stopper.

5. The semiconductor manufacturing system of claim 4, wherein the second stack of semiconductor dies comprises a first die positioned closest to the semiconductor substrate and a last die positioned furthest from the semiconductor substrate, and wherein at least a portion of the last die is positioned beyond the stopper in a direction toward the first pressing surface before movement of the first and second pressing surfaces toward each other.

6. The semiconductor manufacturing system of claim 1, wherein the stopper is positioned between the semiconductor substrate and the first press-stage.

7. The semiconductor manufacturing system of claim 1, wherein the stopper has an annular shape.

8. The semiconductor manufacturing system of claim 1, wherein the first stack of semiconductor dies comprises at least a first semiconductor die and a second semiconductor die, wherein each of the first and second semiconductor dies comprise:
a first surface facing the first press-stage;
a second surface facing the second press-stage;
at least one through-substrate via (TSV) extending through the first and second surfaces of the semiconductor die, the TSV having a first end and a second end;
a conductive pad connected to the first end of at least one TSV; and
a conductive pillar connected to the second end of at least one TSV.

9. The semiconductor manufacturing system of claim 8, wherein the conductive pad of a TSV of the first semiconductor die faces and is spaced from the conductive pillar of a TSV of the second semiconductor die, and wherein a solder ball is positioned in between said conductive pad of the first semiconductor die and said conductive pillar of the second semiconductor die.

10. The semiconductor manufacturing system of claim 9, wherein the conductive pad of a TSV of the first semiconductor die is spaced a first distance from the conductive pillar of a TSV of the second die when the first and second semiconductor dies are in an uncompressed configuration, and wherein the conductive pad of a TSV of the first semiconductor die is spaced a second distance from the conductive pillar of a TSV of the second die when the first and second semiconductor dies are compressed in response to movement of one or both of the first and second press-stages toward each other.

11. The semiconductor manufacturing system of claim 10, wherein the second distance is less than the first distance, and wherein the second distance is at least 3 µm.

* * * * *